United States Patent
Jun et al.

(10) Patent No.: US 6,236,952 B1
(45) Date of Patent: May 22, 2001

(54) SYSTEM AND METHOD FOR AUTOMATICALLY CREATING AND TRANSMITTING TEST CONDITIONS OF INTEGRATED CIRCUIT DEVICES

(75) Inventors: Woo Chul Jun; Jong Hwan Lim; Hyun Suk Park, all of Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/106,853

(22) Filed: Jun. 30, 1998

(30) Foreign Application Priority Data

Jun. 30, 1997 (KR) ................................. 97-29710

(51) Int. Cl.[7] .................................. G01R 31/01
(52) U.S. Cl. ........................... 702/119; 324/500
(58) Field of Search .................. 324/364, 500, 324/73.1, 759, 765; 438/1, 14; 73/1; 700/95; 361/679; 29/679, 832; 717/4; 714/30, 1; 706/906; 702/34–36, 81–84, 108, 117, 123, 188, 183–185, 120, 119, 121, 122, 118

(56) References Cited

U.S. PATENT DOCUMENTS 5,243,274 * 9/1993 Kesley et al. .................... 324/158
5,311,438 * 5/1994 Sellers et al. .................... 364/468
5,539,752 * 7/1996 Berezin ............................ 371/22.1
5,589,765 * 12/1996 Ohmart et al. ................... 324/158.1

FOREIGN PATENT DOCUMENTS 90-2690 * 4/1990 (KR) .
92-6969 * 8/1992 (KR) .

* cited by examiner

Primary Examiner—Marc S. Hoff
Assistant Examiner—Edward Raymond
(74) Attorney, Agent, or Firm—Jones Volentine, LLC (57) ABSTRACT

Production information for ASIC (Application Specific Integrated Circuit) devices is stored in a database of a remote host system, and data necessary for a test program which controls testers for testing the IC devices are automatically created and transmitted to a tester host. This automatic system collects the data necessary for the test condition from the remote host database; creates the test condition by comparing the collected data with a predetermined handling condition; transmits the test condition to a tester host which controls a plurality of testers using corresponding test programs; and loads the test condition into the corresponding test program. This system avoids human errors which often result when test engineers write test conditions manually, and also allows quick response to a situation when new specific IC devices are required by a customer.

14 Claims, 7 Drawing Sheets

| | Database | |
|---|---|---|
| No. | Field | Data item |
| 1 | ord_no | User No. |
| 2 | line_no | Quotation Part No. |
| 3 | schd_no | Schedule No. |
| 4 | sales_code | Sales Code |
| 5 | crc | CRC CheckSum |
| 6 | codepass | Burst Password |
| 7 | user_code | Sales User Code |
| 8 | cms_code | CMS Code |
| 9 | part_no | Part No. |
| 10 | pkg_type | Package Type |
| 11 | customer_id | Customer ID |
| 12 | customer_name | Customer Name |
| 13 | domain | Residence of Customer |
| 14 | rec_date | Order Receiving Date |
| 15 | ord_date | Requested Warehousing Date |
| 16 | ord_qty | Order Quantity |
| 17 | appl_flag | Application |
| 18 | speed | Device Speed |
| 19 | chksum | CheckSum |
| 20 | ctrl_pin | Ce/Oe Pin Option |
| 21 | pkig | Packing Type |
| 22 | new_flag | Repeat/New Order |
| 23 | prty | Normal/Urgent |
| 24 | ord_stat | Order Status |
| 25 | ord_memo | Special Handling |
| 26 | same_code | Same Code List |
| 27 | rtf_date | Order Return Date |
| 28 | rtf_qty | Return Quantity |
| 29 | re_rtf_date | Changed Delivery Date |
| 30 | ord_asgn_date | Quotation Date |
| 31 | ord_asgn_qty | Quotation Quantity |
| 32 | chulha_date | Shipping Date |
| 33 | chulha_qty | Shipping Quantity |
| 34 | ret_desc | Reticle Description |
| 35 | master | Master Code |

FIG. 4

| Necessary Data Item | Field |
|---|---|
| Part No. | part_No |
| Speed | speed |
| Application | appl_flag |
| Ce/Oe Pin Option | ctrl_pin |
| Customer Name | customer_name |
| CheckSum | checksum |
| CRC | crc |
| Burst Password | codepass |
| Package Type | pkg_type |

SYSTEM AND METHOD FOR AUTOMATICALLY CREATING AND TRANSMITTING TEST CONDITIONS OF INTEGRATED CIRCUIT DEVICES

BACKGROUND OF THE INVENTION

1. Field of the Invention

The present invention relates to testing of semiconductor integrated circuit (IC) devices. More particularly, the present invention is directed to a system and a method for automatically creating test conditions necessary for the IC device test and then transmitting the test conditions to a tester host so that the test conditions are loaded into a corresponding test program for controlling each of a plurality of testers.

2. Background of the Related Art

In general, ASIC (Application Specific Integrated Circuit) devices such as mask ROMs (Read Only Memory) are manufactured based on the requirements of the specific users, such as the operational speed of a device, Ce/Oe (Chip enable/Output enable) pin option, operational modes, and ROM codes. This information, so-called predetermined handling conditions, is directly reflected throughout the various portions of the manufacturing process, including the manufacturing mask, wafer fabrication, EDS (Electrical Die Sorting) test, package assembly, and final test processes.

Usually, the production information for the ASIC devices, i.e., the specific user or customer requirements, are first delivered to the marketing/sales department of the semiconductor manufacturer. The marketing/sales department builds a database of production information which is stored in a computer system, e.g., a remote host, so that many different manufacturing departments or factories can gain access to the remote host and separately retrieve information from the production information database for use in producing IC devices having specific functions and quality as required by the user.

For example, within the manufacturing departments, the testing department has to re-write test conditions into a test program for the specific IC devices according to the production information. Conventionally, in order to write the test conditions, the test engineers must access the remote host and download the necessary data from the production database. Reviewing the downloaded data, the test engineers choose and enter data suitable for the specific device IC into a test program. However, since the writing of the test condition is performed manually, human errors are inevitable and it is difficult to quickly respond to situations when new specific devices are ordered. This lengthens the testing time and decreases the efficiency of the test process. Accordingly, it is desirable to automatically create test conditions and to automatically load the test conditions into a test program.

SUMMARY OF THE INVENTION

It is an object of the present invention to automatically create test conditions and to automatically load the test conditions into a test program.

It is another object of the present invention to enhance the efficiency of the test process and reduce the test time.

A system for automatically creating and transmitting a test condition of the present invention comprises data collecting means for collecting data necessary for the test condition from a remote host which has a database containing production information for the IC devices; operating means for creating the test condition by comparing the collected data with a predetermined handling condition; and transmitting means for transmitting the test condition to a tester host which controls a plurality of testers by making use of corresponding test programs, and for loading the test condition into a corresponding test program.

The data collecting means uses SQL (Structured Query Language), which is suitable for interrogating and processing data in a relational database, and the data transmitting means uses a communications protocol such as the TCP/IP protocol (Transmission Control Protocol/Internet Protocol).

A method of the present invention comprises the steps of: collecting data necessary for the test condition from a remote host which has a database containing production information for the IC devices; creating the test condition by comparing the collected data with a predetermined handling condition; and transmitting the test condition to a tester host which controls a plurality of testers by making use of corresponding test programs, and for loading the test condition into a corresponding test program.

BRIEF DESCRIPTION OF THE ATTACHED DRAWINGS

The accompanying drawings illustrate an embodiment of the invention, in which.

DETAILED DESCRIPTION OF PREFERRED EMBODIMENT

Figure 1:
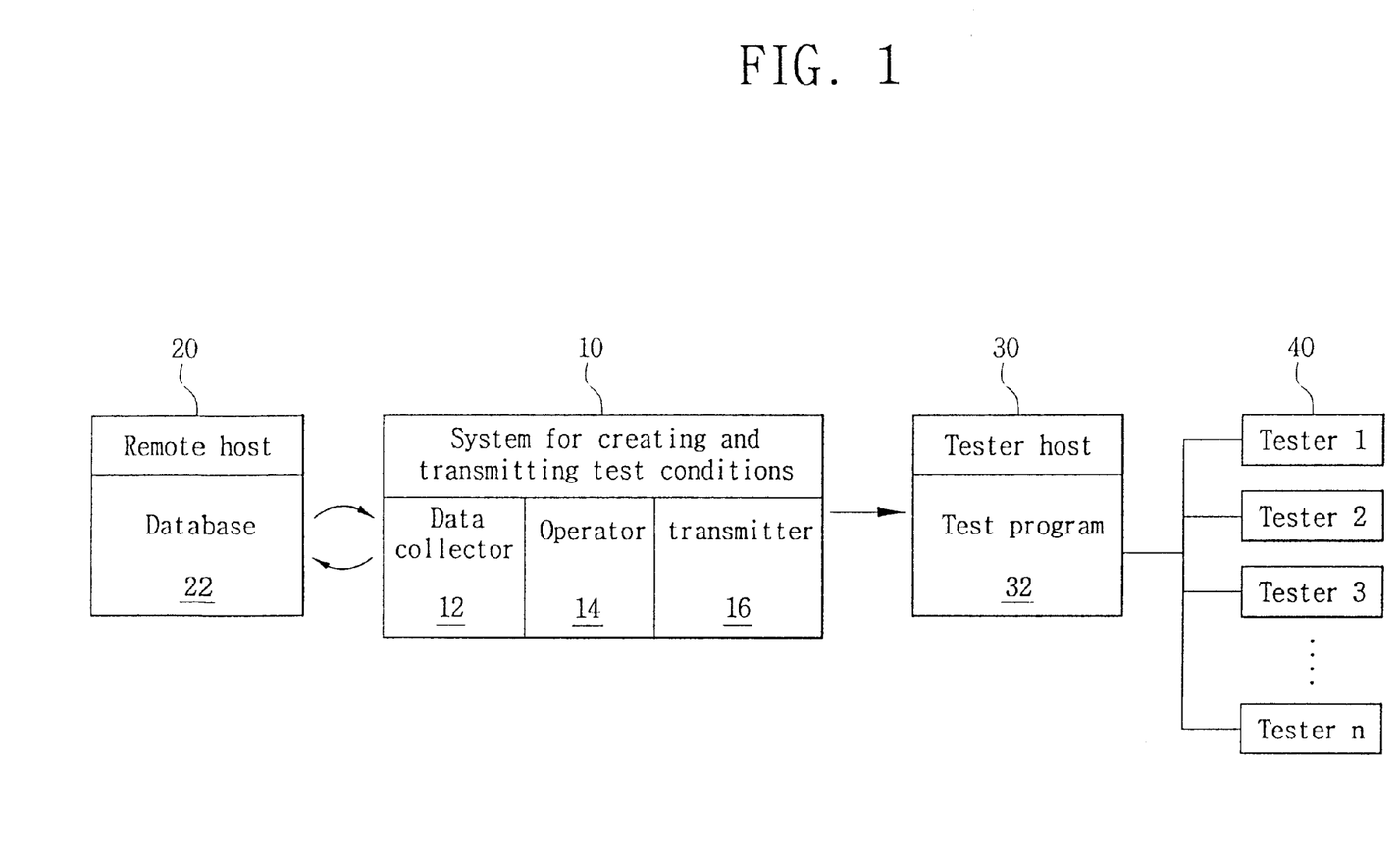
FIG. 1 is a schematic diagram of a system for automatically creating and transmitting test conditions of the present invention.

FIG. 1 is a schematic diagram of a system 10 for automatically creating and transmitting test conditions of the present invention. The system 10 includes a data collector module 12, an operator module 14 and a transmitter module 16.

The data collector module 12 of the system 10 accesses or interrogates a database 22 of a remote host computer system 20, in which all IC device production information is contained, and then downloads the necessary data from the database 22. The data collector 12 may be an SQL (Structured Query Language) engine which produces SQL commands for accessing specific information from a relational database. The SQL engine allows a plurality of users to simultaneously access and search the database 22 of the remote host 20. The data collector 12 retrieves data from the database 22 and arranges the collected data into a test condition input data structure, as described more fully later. The database 22 stored in the remote host 20 is, e.g., an ORACLE database, which is a relational database management system (DBMS) from Oracle Corporation that runs on a wide variety of computer platforms.

The operator module 14 of the system 10 compares the data collected and arranged by the data collector 12 with predetermined handling conditions and then analyzes the data collected to create a test condition.

The transmitter 16 module transmits the test condition created by the operator module 14 to a tester host 30 in a file format which can be used by the tester host 30. For doing this, the transmitter module 16 uses, for example, a remote host connection protocol or file transfer protocol (FTP). In the tester host 30, there is stored a plurality of test programs 32 for controlling a number of testers 40 performing actual test processes. When IC devices (not shown) are mounted into corresponding testers 40, the tester host 30 provides an appropriate test program to the tester 40, and then the tester 40 applies test signals to the IC devices for testing various electrical characteristics of the IC devices.

Figure 2:
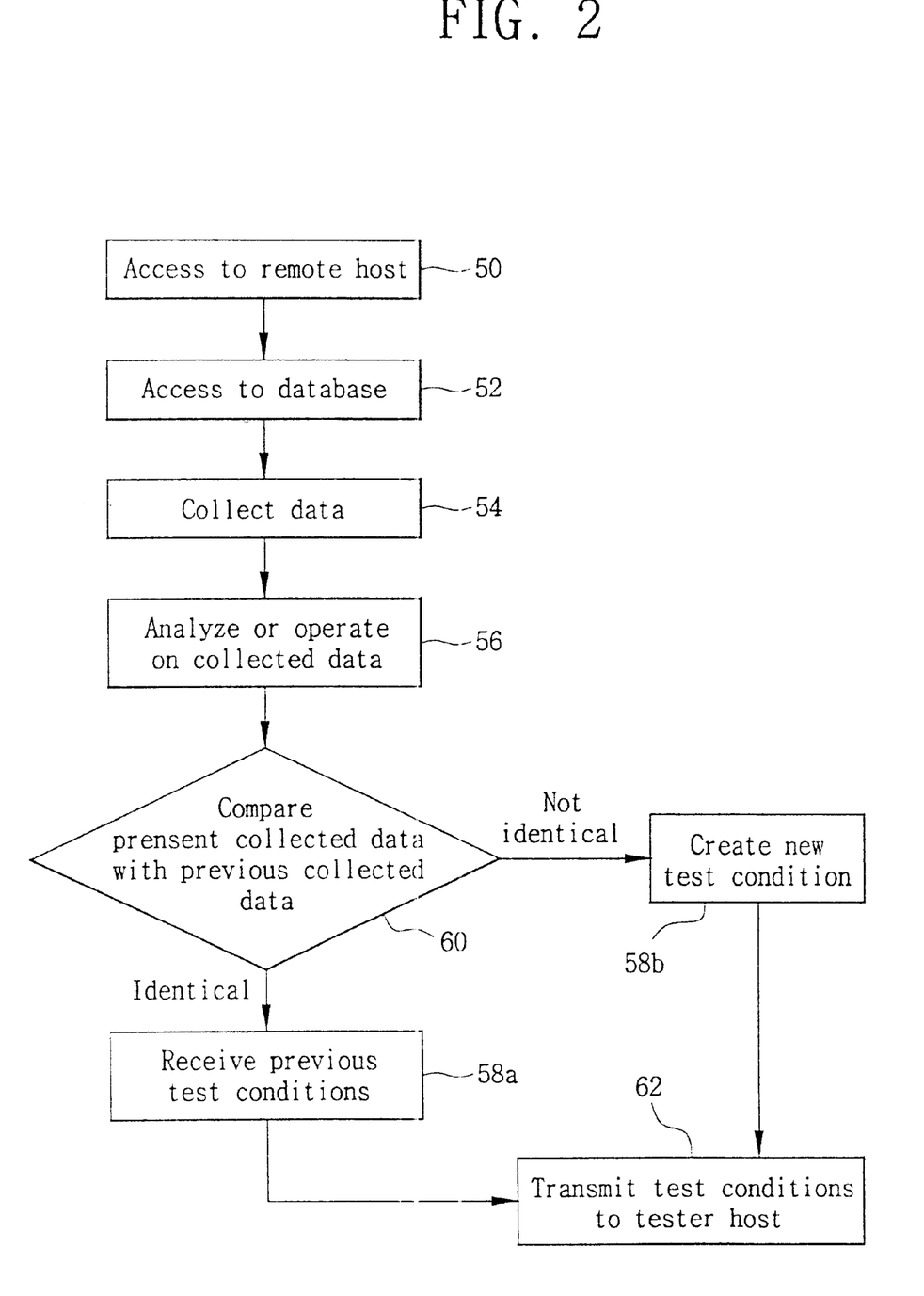
FIG. 2 is a flow diagram of a method for automatically creating and transmitting test conditions of the present invention.

FIG. 2 is a flow diagram of a method of automatic creation and transmission of test conditions according to the present invention. The flow begins by accessing the remote host (step 50). By entering a user name, a password, and an ID (identification) number set by the database program, access to the database containing production information for IC devices is gained (step 52). Necessary data are collected from the database in step 54. For example, the data collection can use the following SQL command:

{select 'item' from 'table name' where 'condition' order by 'sorting option'}

The collected data are operated on or analyzed in step 56. In step 60, the currently collected data from step 56 are then compared with the previous collected data. If the current collected data set are identical to the previously collected data set, a new test condition is not created, rather the previous test condition is retrieved (step 58a) and then transmitted to a tester host system in step 62. On the other hand, if the current collected data set are different from the previous collected data set, a new test condition is created (step 58b) and then transmitted to the tester host in step 62. For the test condition transmission, various known methods, commands or utilities can be used, such as Rlogin (Remote LOGIN), Telnet, PING (Packet Internet Groper), Finger, FTP (File Transfer Protocol/File Transfer Program), and Rcp (Relational control program). The above are implemented by TCP/IP (Transmission Control Protocol/Internet Protocol).

Figure 3:
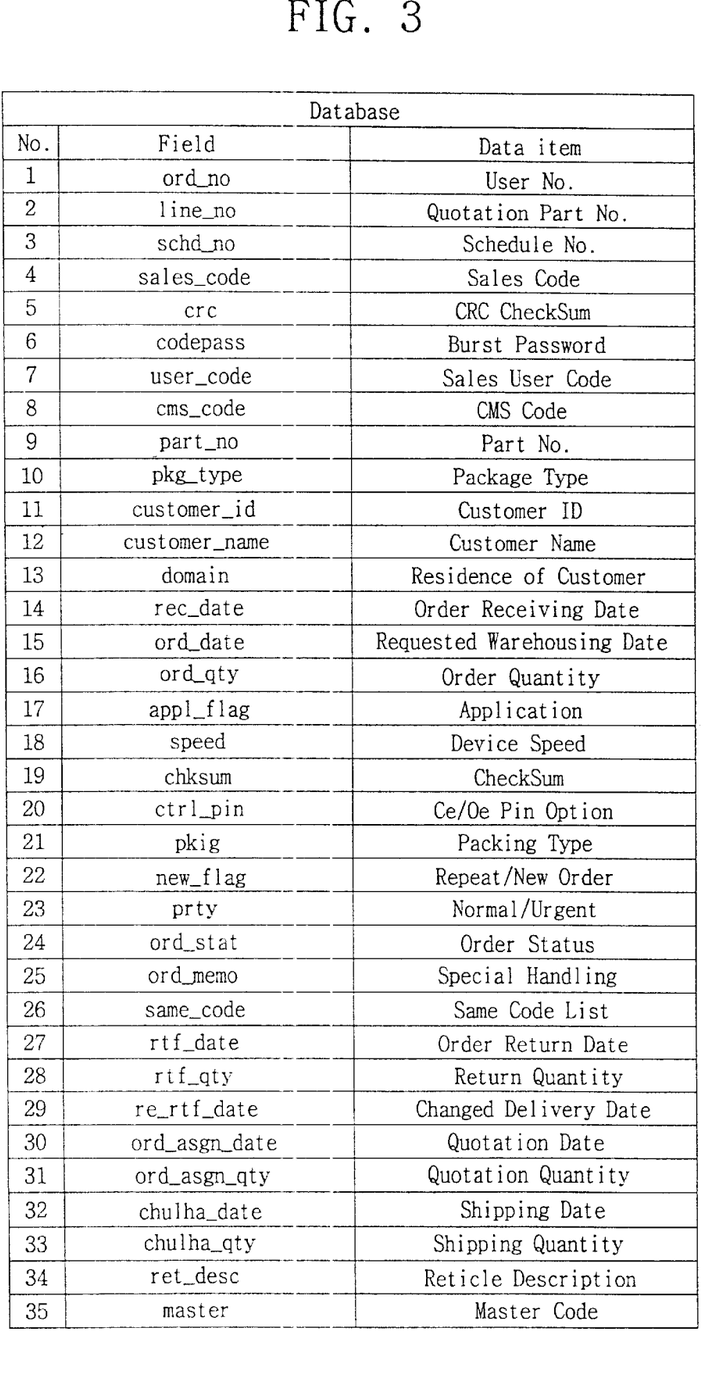
FIG. 3 is an exemplary database structure of production information of IC devices stored in a remote host system.

FIG. 3 shows a data structure of an exemplary database of IC device production information stored in the remote host computer system. The data structure of FIG. 3 has thirty-five fields which represent exemplary production information for a mask ROM device. Of course the fields of the data structure can be varied depending on the IC device in question. The fields of the data structure of FIG. 3 are described as follows: 'ord_no' represents a user number which is numbered serially and assigned to a specific user by the marketing department; 'line_no' denotes a part number of items quoted by a user; 'schd_no' is schedule number indicating a time interval from an order accepting date to a shipping date; 'sales_code' is a user code encoded by the marketing department; 'crc' represents a CRC CheckSum which indicates whether a Cyclical Redundancy Checking (CRC) error checking technique is to be used in the ROM; 'codepass' is a password to be used in a burst mask ROM; 'user_code' indicates a packing method for the ROM in a user code; 'cms_code' describes a packaging type (i.e., tube packing, tray packing, etc.) for the ROM in a user code; 'part_no' is a user code for specifying the wafer fabrication process, because the ROM can have a different specification depending on the user; 'pkg_type' represents the package type (i.e., DIP, SIP, QFP, etc.); 'customer_id' is an identification number of a customer assigned by the marketing department; 'customer_name' indicates a customer name; 'domain' represents a residential district or address of a customer; 'rec_date' means a date when an order is received from a customer; 'ord_date' means a warehousing date requested by the marketing department from the manufacturing facility; 'ord_qty' is order quantity; 'appl_flag' is for identifying the application of the IC device, e.g., either for industry use for example in a personal computer or a facsimile, or for game devices; 'speed' is an operational speed required by a user; 'chksum' is a summation value of the contents of the ROM; 'ctrl_pin' is a specification of control pin options such as a chip enable pin (Ce) and an output enable pin (Oe) defined by the user; 'pkig' represents a packing type such as tape and reel packing, tray packing, and tube packing; 'new_flag' is to identify whether the order is new or old; 'prty' denotes whether or not the delivery date of the IC device is urgent; 'ord_stat' represents the present status of an order; 'ord_memo' is a special handling code, which is to test whether the IC device satisfies operational conditions specially required by the user; 'same_code' is a list of codes having the same predetermined handling conditions; 'rtf_date' denotes a date when the order is returned to the marketing department from the manufacturing departments; 'rtf_qty' denotes quantity of returned IC devices; 're_rtf_date' denotes a changed delivery date depending on the progress of the manufacture of the IC device; 'ord_asgn_date' is a date when the code information or quotation is generated; 'ord_asgn_qty' is quantity recorded on the quotation; 'chulha_date' and 'chulha_qty' are a shipping date and a shipping quantity, respectively; 'ret_desc' represents options with respect to a reticle employed in the wafer fabrication processes; and 'master' is a master code.

Figure 4:
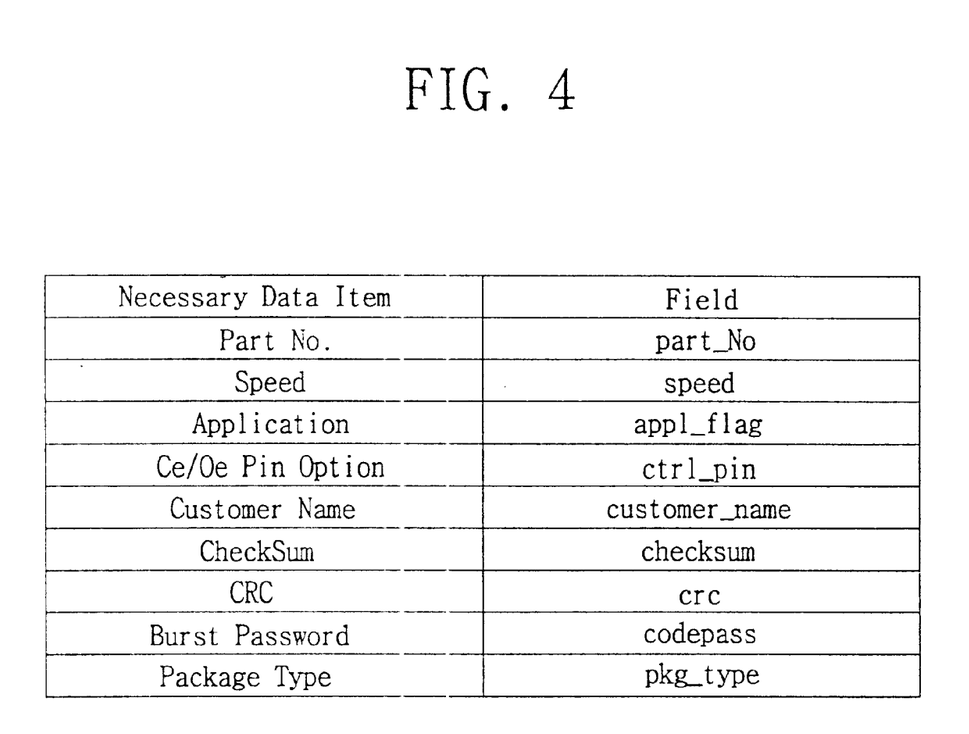
FIG. 4 is an exemplary data set chosen from the database of FIG. 3 for creating a test condition.

Of all the data in the exemplary data structure of FIG. 3, the necessary data for an example test process are contained in the various data fields shown in FIG. 4. FIG. 4 lists exemplary fields and associated content that is necessary for creating a test condition for the ROM device. These include the part number, the speed, the application, the control pin (Ce/Oe) option, the customer name, the checksum, the crc or error checking, the burst password, and the package type. The necessary data items can be varied depending on the ordered IC device and parameters to be tested. The predetermined handling condition from the operator module 14 can be included in the test condition by referring to the customer name.

As seen from the above example, the data fields used in creating the test condition in FIG. 4 are a subset of the data fields resident in the remote host in FIG. 3. Accordingly, the sequence of the present invention involves collecting (i.e., retrieving) and arranging the necessary data for the test condition. For example, the following SQL language commands can be used to retrieve and arrange the necessary data:

{SELECT 'rec_date', 'cms_code', 'customer_name', 'ord_date', 'ord_qty', 'appl_flag', 'speed', 'chksum', 'ctrl_pin', 'crc', 'codepass', 'same_code', 'pkg_type', WHERE ('rec_date', between :from_date and :to_date) and ('com_code' like :code||'%') and ('pkg_type'<>'WFS') and ('pkg_type'<>'chp') ORDERED BY 'pkg_type' ASC, 'cms_code' ASC;}

With these SQL commands, the necessary data items in the fields enumerated after 'SELECT' can be retrieved from the database, but only for those orders having an order receiving date from a specified 'from_date' to a specified 'to_date' under the condition that the part has a package type other than a wafer state (WFS) package and other than a chip state (CHP) package. The collected data are arranged by being sorted by package type first and then by part number. In the operator module 14, these collected and arranged data are compared with a set of previously collected data defining a predetermined handling condition, and then the test condition is created on the basis of the result of the comparison.

Figure 5:
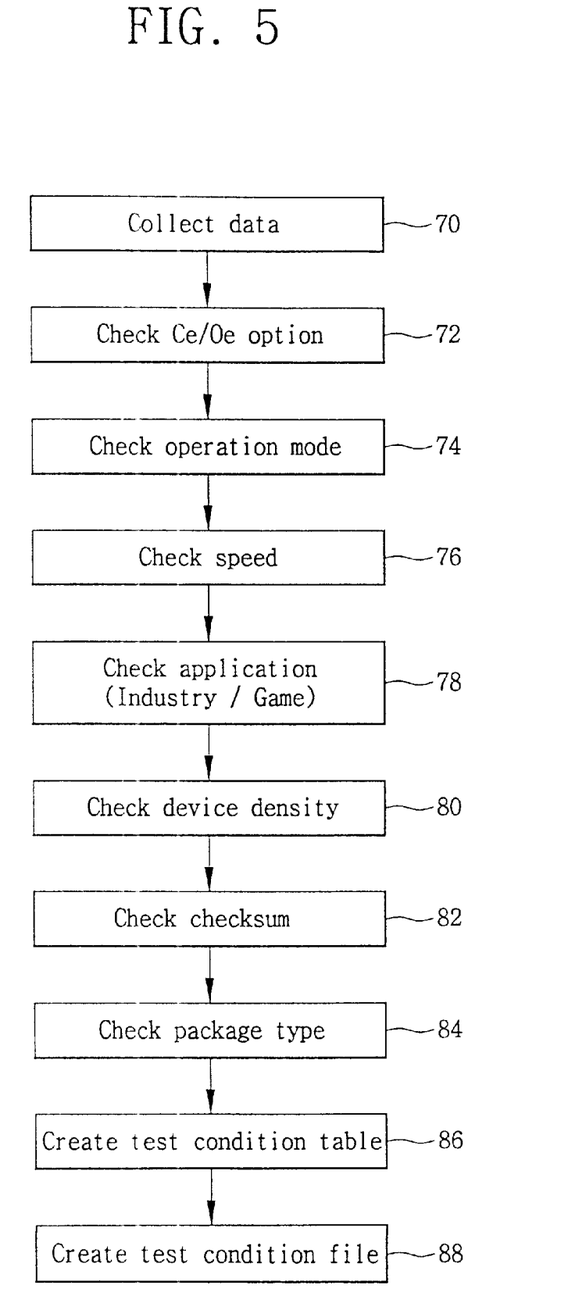
FIG. 5 is a flow diagram of an example test condition data operation according to the present invention.

FIG. 5 is a flow chart for the operator module 14 of the present invention for an exemplary ROM device. When necessary data are collected from the database of the remote host (step 70), the Ce/Oe pin option for a mask ROM device is checked (step 72), and the operation mode of the device is checked (step 74). The operation speed of the device and application of the device (e.g., game or industry) are checked (steps 76 and 78), and the density of the device (e.g., 8 M, 16 M, or 32 M bits) is checked (step 80). The CheckSum and the package type are checked (steps 82 and 84), and a test condition table is created (step 86). Based on the test condition table, a test condition file is generated, which has a format to be used in a test program (step 88).

Figure 6:
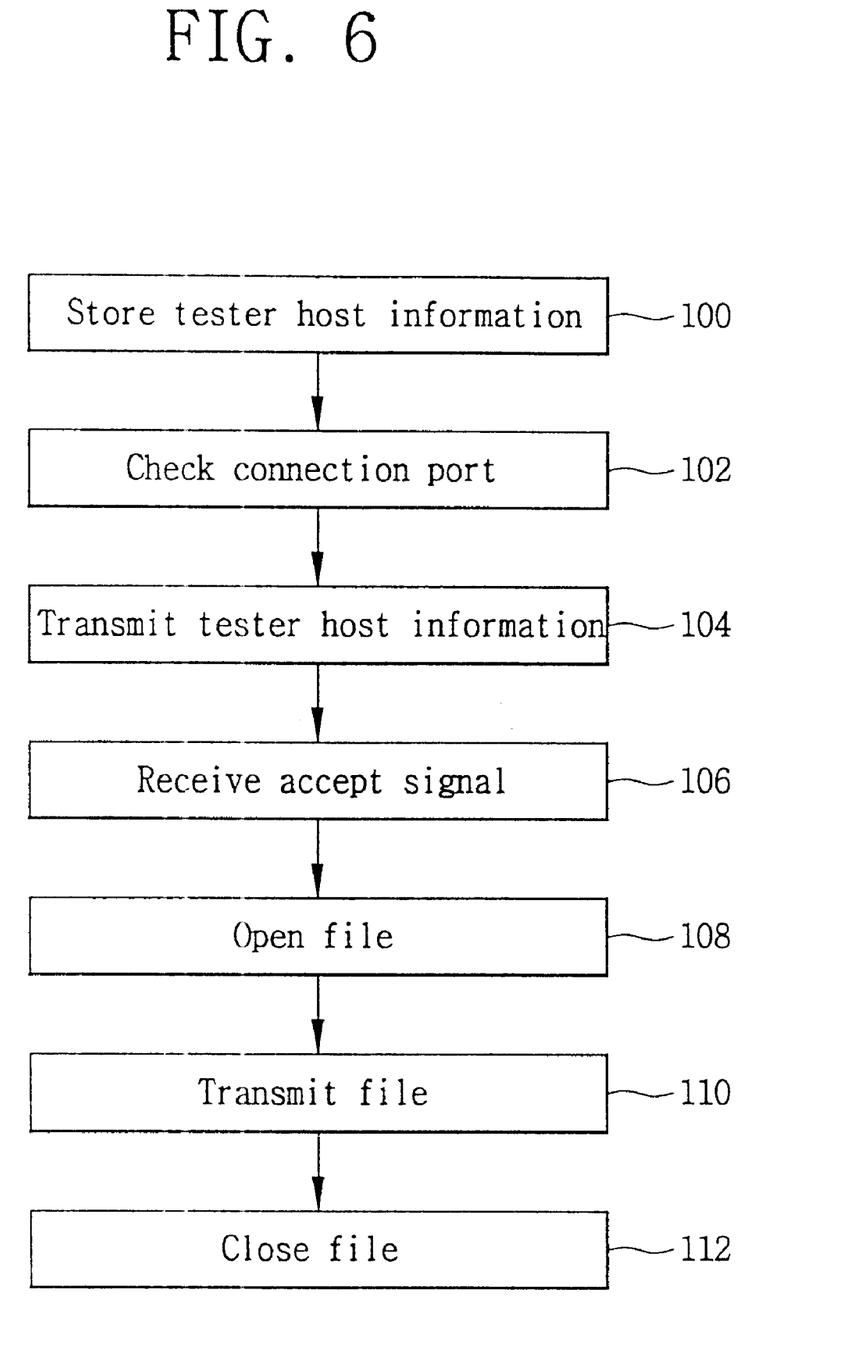
FIG. 6 is a flow diagram of a test condition transmission according to the present invention.

FIG. 6 is a flow chart of the transmitter module 16 of the present invention. In order to transmit the test condition file generated by the operator module 14 of FIG. 5, the state of the network (i.e., communication protocol) between the tester host 30 and the system 10 of the present invention is checked first, and then the system 10 is connected to the tester host 30. The system 10 transmits the test condition file to a predetermined directory of a memory location in the tester host 30.

More specifically, the system 10 stores tester host connection protocol information in step 100. After the test condition file has been created, which completes the process of the operator module 14, the connection port is checked to confirm the network state (step 102), and the tester host connection information is transferred to the tester host 30 from the system 10 (step 104). After receiving an accept signal from the tester host 30 (step 106), the test condition file is opened (step 108), and transmitted by the system 10 (step 110). When the file transmission is completed, the test condition file is closed by the system 10 (step 112).

Figure 7:
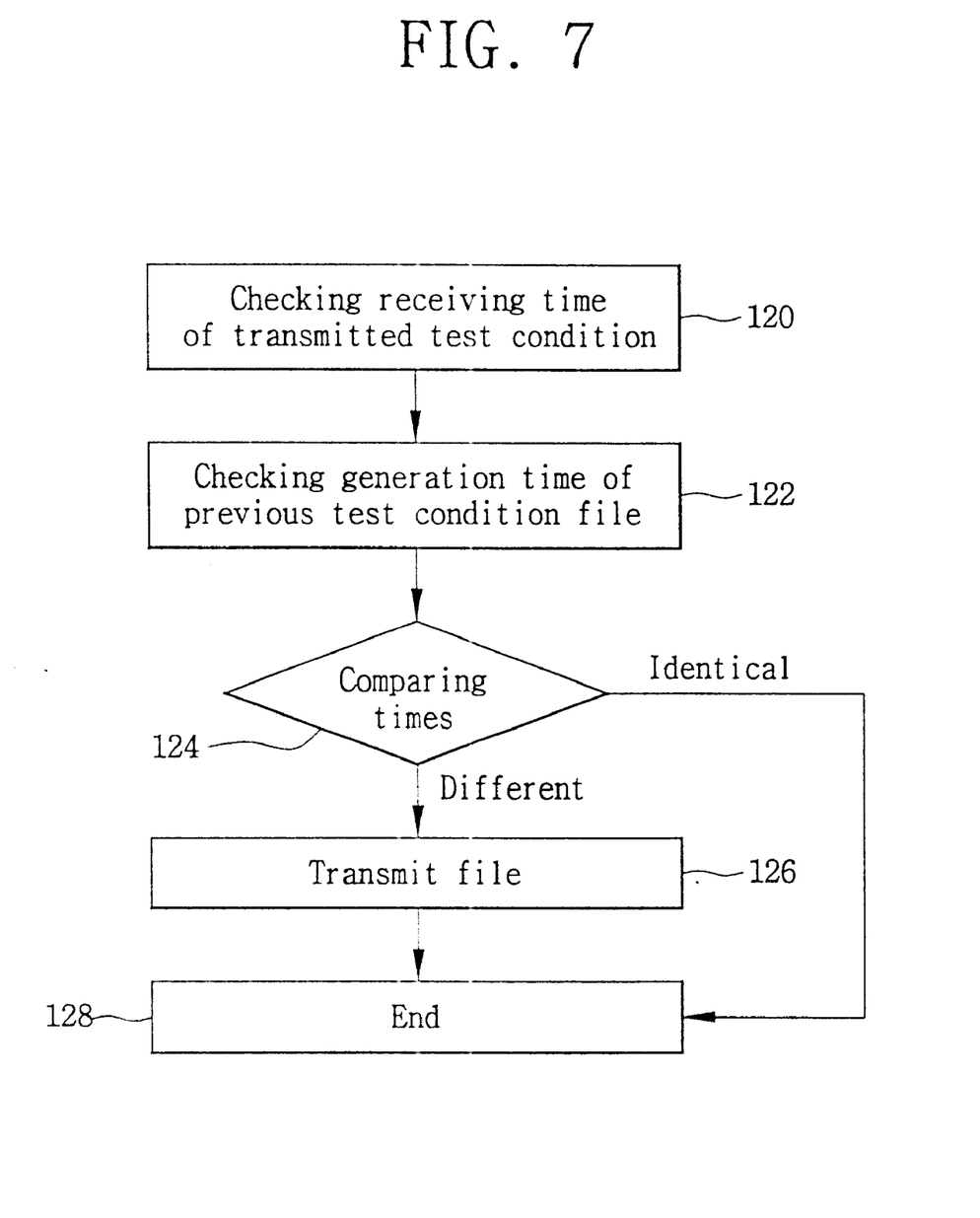
FIG. 7 is a flow diagram of a program for connecting a tester host and the system for automatically creating and transmitting a test condition.

FIG. 7 shows a flow diagram of a program for connecting the tester host 30 and the system 10 of the present invention. This connection program is stored and run in the tester host 30. When the test new condition file is received by the tester host 30, the connection program checks the elapsed time for receiving the new test condition file (step 120) and the elapsed time for receiving the prior (i.e., already existing) test condition file (step 122), and then compares the two times (step 124). If the receiving times for the new and prior test condition files are different, the new test condition file is transmitted by the tester host 30 to one of the testers 40 (step 126). On the other hand, if the receiving times for the new and prior test condition files are the same, the new test condition file is not transmitted by the tester host 30 to one of the testers 40. This is because we assume that if the receiving times for the new and prior test condition files are the same, the tester 40 already has the proper test condition file resident therein, and thus does not need to have the same test condition file transmitted to it again.

While this invention has been described with reference to illustrative embodiments, this description is not intended to be construed in a limiting sense. Various modifications and combinations of the illustrative embodiments, as well as other embodiments of this invention, will be apparent to persons skilled in the art upon reference to the description. It is therefore intended that the appended claims encompass any such modifications or embodiments.

What is claimed is:

1. A system for automatically creating a test condition to be used by a test program in testing of semiconductor integrated circuit (IC) devices and for automatically transmitting the created test condition to a tester containing the test program, said system comprising:

a data collecting module for collecting data necessary for the test condition from a remote host computer, the remote host computer comprising a data structure stored in a memory, the data structure containing integrated circuit (IC) device production information resident in a database;

an operating module for creating the test condition by comparing the collected data with a predetermined handling condition; and a transmitting module for transmitting the test condition to a tester host which controls a plurality of testers by making use of corresponding test programs, and for loading the test condition into a corresponding test program.

2. The system as claimed in claim 1, wherein the IC devices are ASIC (Application Specific Integrated Circuit) devices, and the production information stored in the database comprises requirements determined by a user of the ASIC devices.

3. The system as claimed in claim 2, wherein the ASIC devices are mask ROM (Read Only Memory) devices.

4. The system as claimed in claim 1, wherein the database for the data collecting module uses a relational database query language and search engine.

5. The system as claimed in claim 4, wherein the data collecting module uses a SQL command statement having a format of {select 'items' from 'table name' where 'condition' order by 'sorting option'}.

6. The system as claimed in claim 1, wherein the transmitting module uses a remote host connection protocol.

7. The system as claimed in claim 1, wherein the test condition is generated from a subset of data fields in the data structure, the subset of data fields comprising data indicative of characteristics of the IC device including part number, speed, application, control pin (Ce/Oe) option, customer name, checksum, error checking technique, burst password, and package type.

8. A method for automatically creating a test condition to be used by a test program in testing of semiconductor integrated circuit (IC) devices and for automatically transmitting the created test condition to a tester containing the test program, said method comprising:

collecting, in a test condition creating system, data necessary for the test condition from a remote host, the remote host computer comprising a data structure stored in a memory, the data structure containing integrated circuit (IC) device production information resident in a database;

creating the test condition by comparing the collected data with a predetermined handling condition; and transmitting the test condition to a tester host which controls a plurality of testers by making use of corresponding test programs, and for loading the test condition into a corresponding test program.

9. The method as claimed in claim 8, wherein the IC devices are ASIC (Application Specific Integrated Circuit)

devices, and the production information stored in the database comprises requirements determined by a user of the ASIC devices.

10. The method as claimed in claim 9, wherein the ASIC devices are mask ROM (Read Only Memory) devices.

11. The method as claimed in claim 8, wherein the collecting step comprises steps of:

accessing the remote host;

accessing the data structure of the remote host;

collecting data necessary for the test condition from the data structure while comparing the collected data with a previous test condition; and creating a test condition only when the collected data are different from the previous test condition.

12. The method as claimed in claim 11, wherein the data necessary for the test condition in the collecting step comprises data fields from the data structure, the data fields comprising data indicative of characteristics of the IC device including part number, speed, application, control pin (Ce/Oe) option, customer name, checksum, error checking technique, burst password, and package type.

13. The method as claimed in claim 12, wherein the step of transmitting comprises steps of:

storing information about the tester host connection protocol in the test condition creating system;

checking connection ports between the test condition creating system and the tester host;

transmitting the connection protocol information from the test condition creating system to the tester host;

receiving an accept signal from the tester host, said accept signal allowing access to the tester host; and transmitting, from the test condition creating system to the tester host, a test condition file representing the test condition.

14. The method as claimed in claim 13, wherein the tester host contains a connection program comprising steps of:

determining a first elapsed time for receiving the test condition file;

determining a second elapsed time for receiving a prior test condition file;

comparing the first elapsed time and second elapsed time; and transmitting, from the tester host to a tester, the test condition file if the first elapsed time and second elapsed time are different.

* * * * *